(12) United States Patent
Yu et al.

(10) Patent No.: US 9,064,998 B2
(45) Date of Patent: Jun. 23, 2015

(54) LIGHT EMITTING DIODE AND METHOD FOR MANUFACTURING THE SAME

(71) Applicant: Lextar Electronics Corporation, Hsinchu (TW)

(72) Inventors: Chang-Chin Yu, Zhubei (TW); Hsiu-Mu Tang, Hsinchu (TW); Mong-Ea Lin, Taipei (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/554,534

(22) Filed: Nov. 26, 2014

(65) Prior Publication Data

US 2015/0079716 A1    Mar. 19, 2015

Related U.S. Application Data

(62) Division of application No. 13/796,935, filed on Mar. 12, 2013, now Pat. No. 8,946,675.

(30) Foreign Application Priority Data

Jun. 26, 2012   (TW) .............................. 101122831 A

(51) Int. Cl.
| | |
|---|---|
| *H01L 33/06* | (2010.01) |
| *H01L 33/32* | (2010.01) |
| *B82Y 40/00* | (2011.01) |
| *H01L 33/18* | (2010.01) |
| *H01L 33/20* | (2010.01) |
| *H01L 33/42* | (2010.01) |

(52) U.S. Cl.
CPC ................ *H01L 33/06* (2013.01); *H01L 33/32* (2013.01); *Y10S 977/762* (2013.01); *Y10S 977/95* (2013.01); *B82Y 40/00* (2013.01); *H01L 33/18* (2013.01); *H01L 33/20* (2013.01); *H01L 33/42* (2013.01)

(58) Field of Classification Search
CPC ......... H01L 33/06; H01L 33/18; H01L 33/20; H01L 33/32; H01L 33/42; B82Y 20/00
See application file for complete search history.

(56) References Cited

U.S. PATENT DOCUMENTS

| | | |
|---|---|---|
| 7,396,696 B2 | 7/2008 | Kim et al. |
| 2007/0077670 A1 | 4/2007 | Kim et al. |
| 2007/0126013 A1 | 6/2007 | Kim et al. |
| 2008/0210956 A1 | 9/2008 | Kim |
| 2009/0246901 A1 | 10/2009 | Gilet et al. |
| 2011/0114915 A1 | 5/2011 | Lee et al. |
| 2011/0260191 A1 | 10/2011 | Kim et al. |
| 2012/0013888 A1 | 1/2012 | Aoki |
| 2012/0161185 A1 | 6/2012 | Wang |

FOREIGN PATENT DOCUMENTS

TW        200731563        8/2007

*Primary Examiner* — Peniel M Gumedzoe
(74) *Attorney, Agent, or Firm* — Moser Taboada

(57) ABSTRACT

A light emitting diode includes a substrate, a first-type semiconductor layer, a nanorod layer and a transparent planar layer. The first-type semiconductor layer is disposed over the substrate. The nanorod layer is formed on the first-type semiconductor layer. The nanorod layer includes a plurality of nanorods and each of the nanorods has a quantum well structure and a second-type semiconductor layer. The quantum well structure is in contact with the first-type semiconductor layer, and the second-type semiconductor layer is formed on the quantum well structure. The transparent planar layer is filled between the nanorods. A surface of the second-type semiconductor layer is exposed out of the transparent planar layer.

7 Claims, 5 Drawing Sheets

LIGHT EMITTING DIODE AND METHOD FOR MANUFACTURING THE SAME

RELATED APPLICATIONS

The present application is a divisional of U.S. application Ser. No. 13/796,935, filed on Mar. 12, 2013, which was based on, and claims priority from, Taiwan Patent Application Serial Number 101122831, filed Jun. 26, 2012, the disclosure of which is hereby incorporated by reference herein in its entirely.

BACKGROUND

1. Technical Field

The present invention relates to a light emitting diode and a method for manufacturing the light emitting diode. More particularly, the present invention relates to a light emitting diode having a number of nanorods and a method for manufacturing the light emitting diode.

2. Description of Related Art

There has been rapid progress in light emitting technologies in recent years, and high luminous efficiency and low power consumption are required for light emitting devices. Among the various types of light emitting technologies, much attention has been given to light emitting diode (LED). LEDs are advantageous in high luminous efficiency, fast response time, long lifespan and mercury free. Furthermore, LEDs are small in size, and provide high color gamut as well as high resistance to external impact. Therefore, LEDs gradually replace conventional light emitting devices. LEDs have been applied in various fields due to its significant progress, and it seems to become the major light source for $21^{st}$ century. In view of the application of light sources, one critical specification parameter is the light-emitting efficiency, and therefore many researchers commit to increase the light-emitting efficiency of LEDs.

SUMMARY

According to one aspect of the present disclosure, a light emitting diode is provided. The light emitting diode includes a substrate, a first-type semiconductor layer, a nanorod layer and a transparent planar layer. The first-type semiconductor layer is disposed over the substrate. The nanorod layer is formed on the first-type semiconductor layer. The nanorod layer includes a plurality of nanorods and each of the nanorods has a quantum well structure and a second-type semiconductor layer. The quantum well structure is in contact with the first-type semiconductor layer, and the second-type semiconductor layer is formed on the quantum well structure. The transparent planar layer is filled between the nanorods, in which a surface of the second-type semiconductor layer is exposed out of the transparent planar layer.

According to one embodiment of the present disclosure, the transparent planar layer is made of an insulating material comprising benzocyclobutene (BCB).

According to one embodiment of the present disclosure, the quantum well structure has a width W and a height H, and the width W and the height H satisfy the following formula (I):

$$0.5\,H \leq W < 10\,H \qquad \text{formula (I)}.$$

According to one embodiment of the present disclosure, the width W is substantially equal to the height H.

According to one embodiment of the present disclosure, the height H is about 5 nm to about 50 nm.

According to one embodiment of the present disclosure, a spacing interval between any two adjacent nanorods is about 2 nm to about 3 nm.

According to one embodiment of the present disclosure, the light emitting diode further includes a transparent electrode layer that covers the transparent planar layer and a top portion of each of the second-type semiconductor layers.

According to one embodiment of the present disclosure, the light emitting diode may further include a first type contact pad and a second type contact pad. The first type contact pad is disposed on the first-type semiconductor layer. The second type contact pad is disposed on the transparent electrode layer.

According to one embodiment of the present disclosure, the first-type semiconductor layer comprises a N-type gallium nitride layer. Each of the quantum well structures includes a multiple quantum well structure. Each of the second-type semiconductor layers includes P-type gallium nitride.

According to one embodiment of the present disclosure, the light emitting diode may further include an undoped gallium nitride layer, and the undoped gallium nitride layer is disposed between the first-type semiconductor layer and the substrate.

According to one embodiment of the present disclosure, the first-type semiconductor layer, the nanorod layer and the transparent planar layer constitute a trapezoid sidewall structure.

According to one embodiment of the present disclosure, the trapezoid sidewall structure has an oblique plane that forms an included angle of about 30 degrees to about 150 degrees with the substrate.

According to one aspect of the present disclosure, a method for manufacturing a light emitting diode is provided. The method includes the steps of: providing a substrate; forming a first-type semiconductor layer on the substrate; forming a quantum well layer on the first-type semiconductor layer; forming a second-type semiconductor layer on the quantum well layer; patterning the quantum well layer and the second-type semiconductor layer to form a plurality of nanorods; filling a transparent planar material into a space between the nanorods, in which a top portion of each of the nanorods is exposed out of the transparent planar material; and forming a transparent electrode layer to cover the transparent planar material and the top portion.

According to one embodiment of the present disclosure, the step of patterning the quantum well layer and the second-type semiconductor layer includes a step of forming a quantum well structure in each of the nanorods. Each of the quantum well structure has a width W and a height H, and the width W and the height H satisfy the following formula (I):

$$0.5\,H \leq W < 10\,H \qquad \text{formula (I)}.$$

According to one embodiment of the present disclosure, the step of patterning the quantum well layer and the second-type semiconductor layer includes the steps of: forming a patterned hard mask on the second-type semiconductor layer, in which a portion of the second-type semiconductor layer is exposed; removing the exposed portion of the second-type semiconductor layer and the quantum well layer there under to form the nanorods; and removing the patterned hard mask on the nanorods.

According to one embodiment of the present disclosure, the step of filing the transparent planar material includes filling benzocyclobutene into the space between the nanorods.

According to one embodiment of the present disclosure, the method may further include removing a portion of the second-type semiconductor layer, a part of the nanorods, a portion of the first-type semiconductor layer and a portion of the transparent planar material to form a trapezoid sidewall structure such that a portion of the first-type semiconductor layer is exposed.

According to one embodiment of the present disclosure, the method may further include a step of forming a first connecting pad and a second connecting pad respectively on the transparent electrode layer and the exposed portion of the first-type semiconductor layer.

According to one embodiment of the present disclosure, the first-type semiconductor layer includes N-type gallium nitride, and the second-type semiconductor layer includes P-type gallium nitride.

According to one embodiment of the present disclosure, the method may further include a step of forming an undoped gallium nitride layer on the substrate prior to forming the first-type semiconductor layer.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1A:
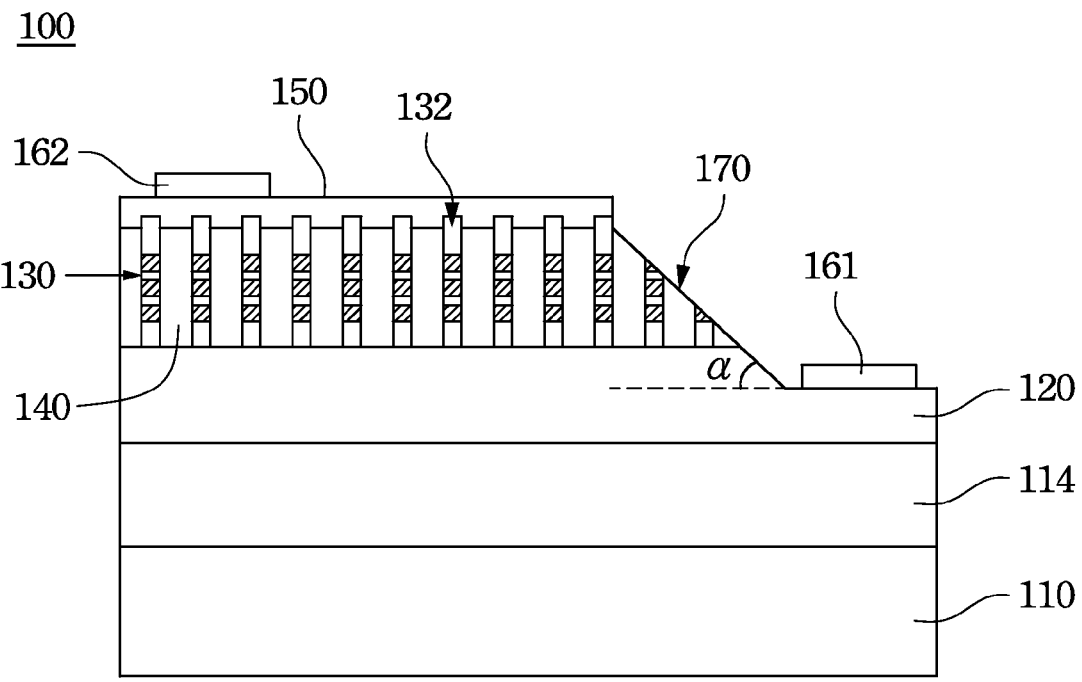
FIG. 1A is a cross-sectional view schematically illustrating a light emitting diode according to one embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

According to one aspect of the present disclosure, a light emitting diode and a method for manufacturing the light emitting diode are disclosed. The following disclosure provides many different embodiments, or examples, for implementing different features of the invention. Specific examples of components and arrangements are described below. These are, of course, merely examples and are not intended to be limiting. For example, the formation of a first layer over or on a second layer in the description that follows may include embodiments in which the first and second layers are formed in direct contact, and may also include embodiments in which additional layers may be formed between the first and second layers, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1A is a cross-sectional view schematically illustrating a light emitting diode 100 according to one embodiment of the present disclosure. The light emitting diode 100 includes a substrate 110, a first-type semiconductor layer 120, a nanorod layer 130 and a transparent planar layer 140.

The substrate 110 is configured to support structures formed thereon, and to provide a surface required for growing an epitaxial layer. The substrate 110 may be a sapphire substrate, a silicon carbide (SiC) substrate, a gallium nitride substrate, a zinc oxide (ZnO) substrate or a silicon substrate, for example.

The first-type semiconductor layer 120 is disposed over the substrate 110. The first-type semiconductor layer 120 may be an N-type gallium nitride layer, for example.

In one embodiment, the light emitting diode 100 may optionally includes an undoped gallium nitride layer 114 positioned between the first-type semiconductor layer 120 and the substrate 110. The undoped gallium nitride layer 114 may be configured as a buffer layer between the substrate 110 and the first-type semiconductor layer 120.

Figure 1B:
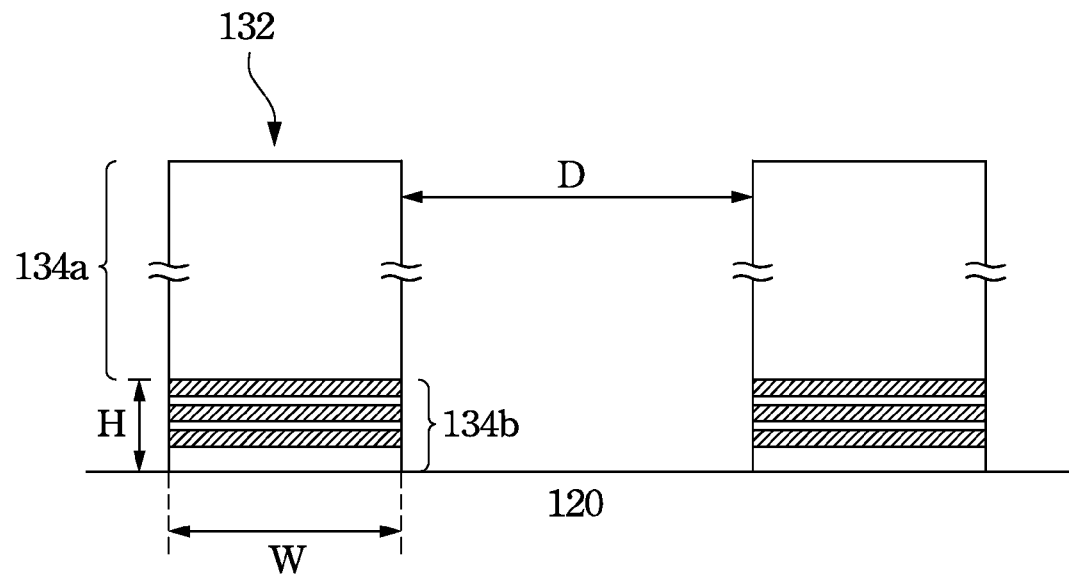
FIG. 1B is a cross-sectional view schematically illustrating nanorods according to one embodiment of the present disclosure.

The nanorod layer 130 is formed on the first-type semiconductor layer 120. The nanorod layer 130 includes a plurality of nanorods 132, which stand erect on the first-type semiconductor layer 120. FIG. 1B is a cross-sectional view schematically illustrating the nanorod 132 according to one embodiment of the present disclosure. As depicted in FIG. 1B, each of the nanorod 132 includes a second-type semiconductor layer 134a and a quantum well structure 134b. The quantum well structure 134b is in contact with the first-type semiconductor layer 120, and the second-type semiconductor layer 134a is formed on the quantum well structure 134b. In examples, the quantum well structure 134b may be a multiple quantum well structure, and the second-type semiconductor layer 134a may be a P-type gallium nitride layer. In one embodiment, the spacing interval D between any two adjacent nanorods 132 is about 2 nm to about 3 nm.

In another embodiment, the quantum well structure 134b has a width W and a height H. The width W and the height H satisfy the following formula (I):

$$0.5\ H \leq W < 10\ H \qquad\qquad \text{formula (I).}$$

In other words, the width W of the quantum well structure 134b is greater than or equal to 0.5 fold of the height H of the quantum well structure 134b, but the width W of the quantum well structure 134b is less than 10 folds of the height H of the quantum well structure 134b. That is, the ratio of the width W to the height H (W/H) is greater than or equal to 0.5, but less than 10.

Figure 4:
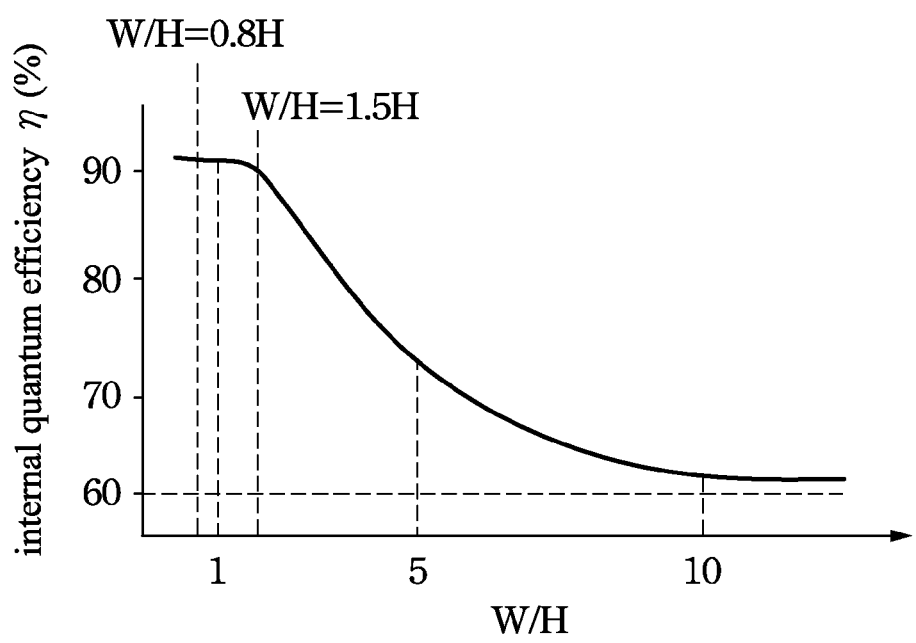
FIG. 4 is a graph showing the relationship between the internal quantum efficiency ($\eta$) of the light emitting diode and the ratio of the width to the height (W/H) of the quantum well structure according to one embodiment of the present disclosure.

In this embodiment, the aforementioned relationship between the width W and the height H provides a significant effect on the internal quantum efficiency. FIG. 4 is a graph showing the relationship between the internal quantum efficiency (η) of the light emitting diode and the ratio of the width to the height (W/H) of the quantum well structure 134b, according to one embodiment of the present disclosure. When the ratio of the width W to the height H (W/H) of the quantum well structure 134b is greater than 10, the internal quantum efficiency η is about 60%. Significantly, when the ratio of W/H is less than 10, the internal quantum efficiency η dramatically increases. When the ratio of W/H is less than 1.5, the internal quantum efficiency η is significantly raised to a level of about 90%. Therefore, according to one embodiment of the present disclosure, the ratio of W/H is about 0.8 to about 1.5, preferably the width W substantially equal to the height H. In one specific example, the height H is about 5 nm to about 50 nm.

Accordingly, the light-emitting efficiency of the light emitting diode may be significantly increased according to the embodiments of the present disclosure.

The transparent planar layer 140 is filled in the void space between the nanorods 132. It is noted that the top portion of each of the nanorods 132 is exposed out of the transparent planar layer 140. In particular, the top surface of the second-type semiconductor layer 134a is exposed out of the transparent planar layer 140. In other words, the transparent planar layer 140 substantially encircles and covers the sidewall of each of the nanorods 132, but the transparent planar layer 140 does not cover the top portions of the nanorods 132. In one embodiment, transparent planar layer 140 is made of an insulating material comprising benzocyclobutene (BCB). The benzocyclobutene exhibits excellent flowability and planarization avail, so that the tiny space between the nanorods 132 may be well filled with benzocyclobutene material, without bubbles formed therein. Moreover, the transparent planar layer 140 may protect the nanorods 132 from damage due to external impact.

In one embodiment, the light emitting diode 100 may further include a transparent electrode layer 150, a first type contact pad 161 and a second type contact pad 162. The transparent electrode layer 150 covers the transparent planar layer 140 and the top portion of the second-type semiconductor layer 134a. The transparent electrode layer 150 is in contact with the second-type semiconductor layer 134a, so that the transparent electrode layer 150 may be electrically connected to the first-type semiconductor layer 120 through the nanorods 132. In addition, the first type contact pad 161 is disposed on the first-type semiconductor layer 120, whereas the second type contact pad 162 is disposed on the transparent electrode layer 150. The first and second type contact pads 161, 162 may be used to electrically connect to a power supply or an electrical circuit.

In another embodiment, the first-type semiconductor layer 120, the nanorod layer 130 and the transparent planar layer 140 constitute a trapezoid sidewall structure 170 of the light emitting diode 100, as depicted in FIG. 1A. Specifically, the trapezoid sidewall structure 170 may include an oblique plane, which forms an included angle α with the top surface of the substrate 110. The included angle α, for example, ranges from about 30 degrees to about 150 degrees. The formation of the trapezoid sidewall structure 170 may increase the light-extraction efficiency of the light emitting diode 100.

Figure 2:
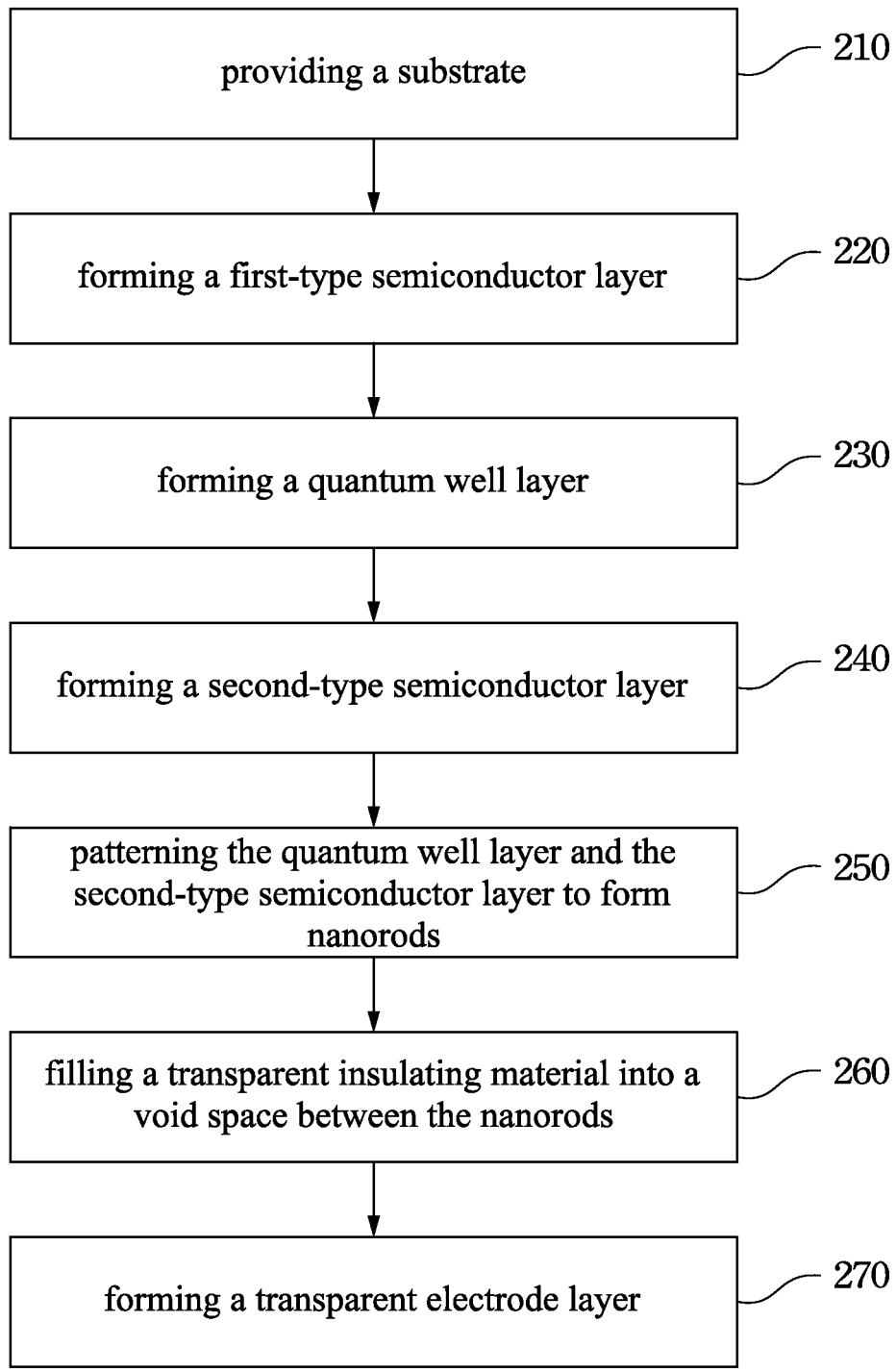
FIG. 2 is a flow chart showing a method for manufacturing a light emitting diode according to one embodiment of the present disclosure.

According to another aspect of the present disclosure, a method for manufacturing a light emitting diode is provided. FIG. 2 is a flow chart showing a method 200 for manufacturing a light emitting diode according to one embodiment of the present disclosure. The method 200 at least includes step 210 to step 270. FIGS. 3A-3E are cross-sectional views illustrating the process steps of the method 200 illustrated in FIG. 2.

Figure 3A:
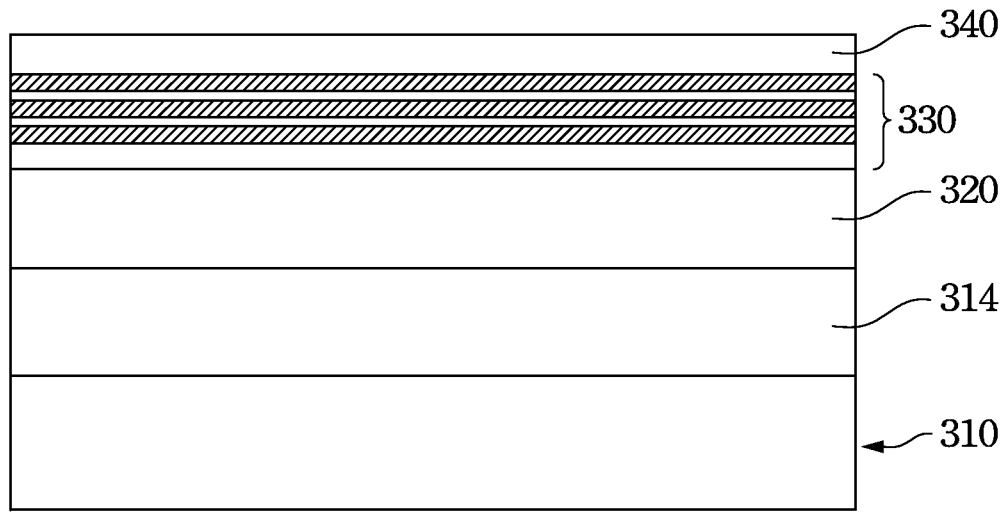
FIGS. 3A-3E are cross-sectional views illustrating the process steps of the method illustrated in FIG. 2.

In step 210, a substrate 310 is provided, as depicted in FIG. 3A. The substrate 310 may be a sapphire substrate, a silicon carbide (SiC) substrate, a gallium nitride substrate, a zinc oxide (ZnO) substrate or a silicon substrate, for example.

In step 220, a first-type semiconductor layer 320 is formed over the substrate 310, as depicted in FIG. 3A. For instance, the first-type semiconductor layer 320 may be formed by hydride vapor phase epitaxy processes, metal organic chemical vapor deposition processes or molecular beam epitaxy processes. In examples, the first-type semiconductor layer 320 may be a semiconductor layer that comprises N-type gallium nitride.

After step 210, but prior to step 220, an undoped gallium nitride layer 314 may optionally be formed on the substrate 310, as illustrated in FIG. 3A. The undoped gallium nitride layer 314 may be configured as a buffer layer between the substrate 310 and the first-type semiconductor layer 320.

In step 230, a quantum well layer 330 is formed on the first-type semiconductor layer 320, as depicted in FIG. 3A. For instance, the quantum well layer 330 may be a multiple quantum well layer.

In step 240, a second-type semiconductor layer 340 is formed on the quantum well layer 330. For instance, the second-type semiconductor layer 340 may be formed by hydride vapor phase epitaxy processes, metal organic chemical vapor deposition processes or molecular beam epitaxy processes. In examples, the second-type semiconductor layer 340 may be a semiconductor layer that comprises P-type gallium nitride.

Figure 3B:
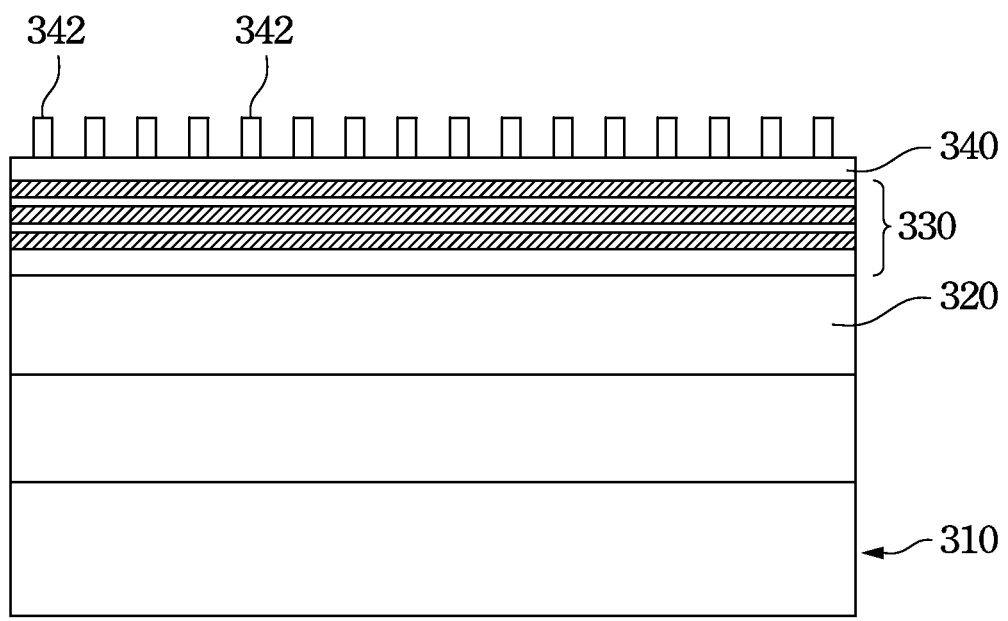
Figure 3C:
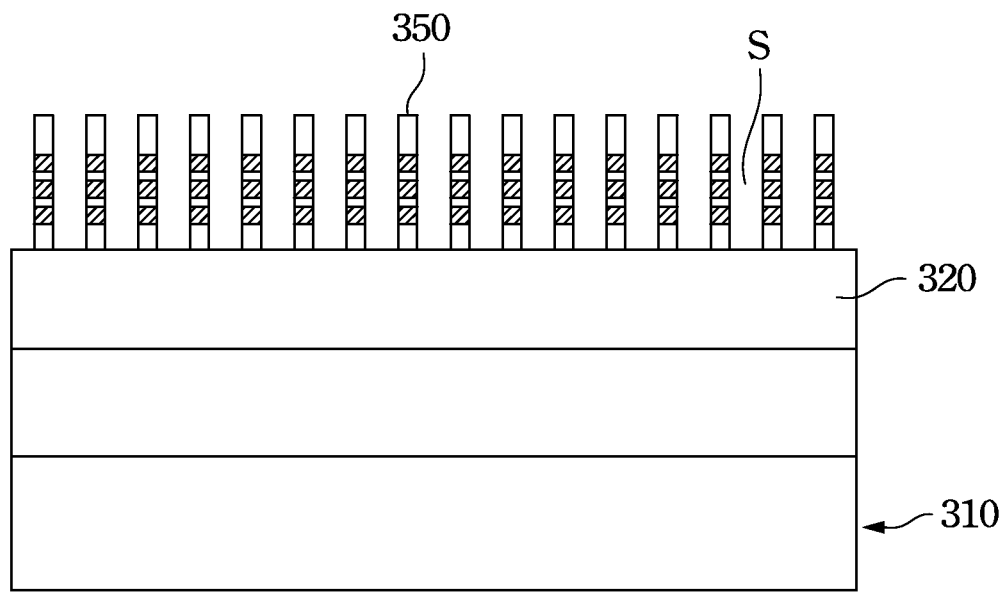

In step 250, both the quantum well layer 330 and the second-type semiconductor layer 340 are patterned to form a plurality of nanorods 350, as depicted in FIG. 3C. In one embodiment, the quantum well layer 330 and the second-type semiconductor layer 340 are patterned through the method described below. As depicted in FIG. 3B, a patterned hard mask 342 is formed on the second-type semiconductor layer 340. A portion of the second-type semiconductor layer 340 is exposed, in which the exposed portion is not covered by the patterned hard mask 342. Subsequently, the exposed portion of the second-type semiconductor layer 340 and the quantum well layer 330 there under are removed to form the nanorods 350. In particular, conventional dry etching techniques may be employed to etch the quantum well layer 330 and the second-type semiconductor layer 340. Thereafter, the patterned hard mask 342 on the nanorods 350 is removed and the structure shown in FIG. 3C is obtained. Accordingly, a void space S is formed between these nanorods 350 such that the nanorods 350 are spaced apart from each other. Each of the nanorods 350 includes a portion of the quantum well layer 330 and a portion of the second-type semiconductor layer 340. In one example, each of the nanorods 350 has a substantially identical width, in which the width of the top portion of each nanorod 350 substantially equals the width of the bottom portion of said nanorod 350.

In one embodiment, the step 250 of patterning the quantum well layer 330 and the second-type semiconductor layer 340 includes forming a quantum well structure 134b (shown in FIG. 1B) in each of the nanorods, and each quantum well structure 134b has a width W and a height H that satisfy the following formula (I):

$$0.5\,H \leq W < 10\,H \quad \text{formula (I)}.$$

In this embodiment, the height H of the quantum well structure 134b is equal to the thickness of the quantum well layer 330. Accordingly, the step of patterning the quantum well layer 330 and the second-type semiconductor layer 340 has to take account of the thickness of the quantum well layer 330 formed in the step 230 such that the width of the quantum well structure 134b may satisfy formula (I).

Figure 3D:
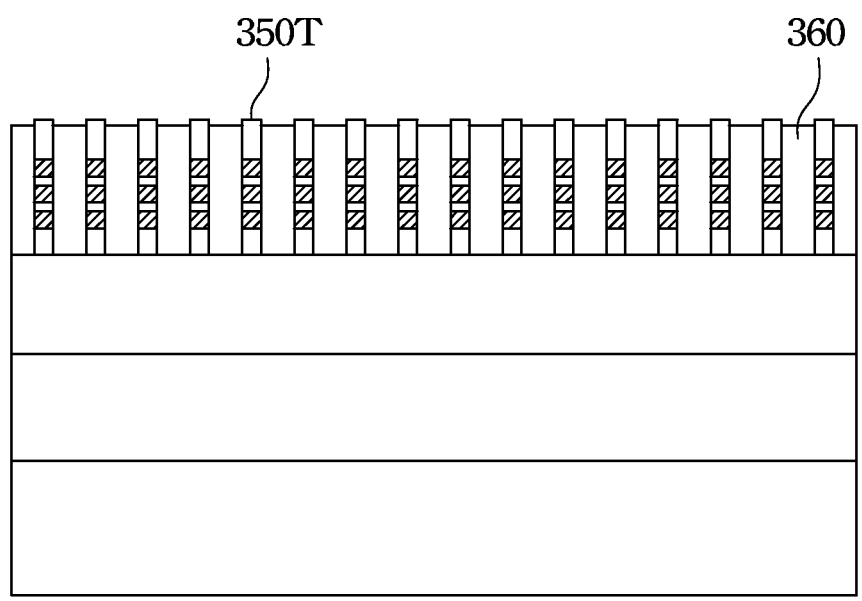

In step 260, a transparent planar material 360 is filled into the void space between the nanorods 350, as depicted in FIG. 3D. The top portion 350T of each of the nanorods 350 is exposed out of the transparent planar material 360. In one example, the step of filling the transparent planar material 360 includes filling benzocyclobutene into the void space between the nanorods 350. In other words, the transparent planar material 360 may include benzocyclobutene.

Figure 3E:
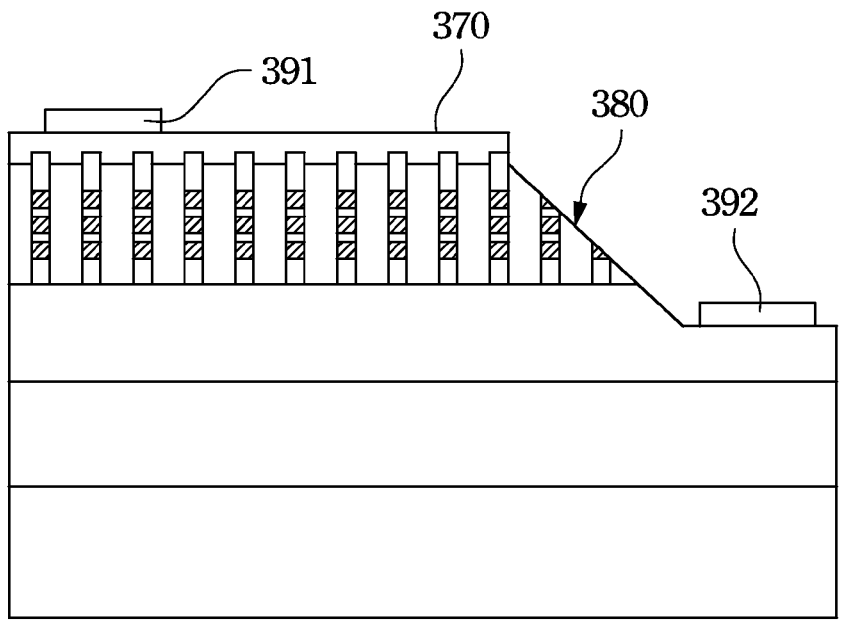

In step 270, a transparent electrode layer 370 is formed to cover the transparent planar material 360 and the top portion 350T of each of the nanorods, as depicted in FIG. 3E. In particular, the transparent electrode layer 370 is in contact with each of the nanorods 350 so that the transparent electrode layer 370 may be electrically connected to the first-type semiconductor layer 320 through the nanorods 350.

In one embodiment, after the step 270, the method 200 may optionally includes removing a portion of the second-type semiconductor layer 340, a part of the nanorods 350, a portion of the first-type semiconductor layer 320 and a portion of the transparent planar material 360 to form a trapezoid sidewall structure 380, as depicted in FIG. 3E. The trapezoid sidewall structure 380 may include an oblique plane, which forms an included angle of about 30 degrees to about 150 degrees with the top surface of the substrate. In the step of forming the trapezoid sidewall structure 380, another portion of the first-type semiconductor layer 320 is exposed.

In another embodiment, after forming the trapezoid sidewall structure 380, the method 200 may optionally include forming a first connecting pad 391 and a second connecting pad 392 respectively on the transparent electrode layer 370 and the exposed portion of the first-type semiconductor layer 320, as depicted in FIG. 3E.

According to the method disclosed herein, a number of nanorods are formed in the light emitting diode, and more significantly the dimension of each of the nanorods is excellently uniform. In addition, the method disclosed herein is suitable for large-area production of light emitting diodes with nanorods.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for manufacturing a light emitting diode, comprising:
   providing a substrate;
   forming a first-type semiconductor layer on the substrate;
   forming a quantum well layer on the first-type semiconductor layer;
   forming a second-type semiconductor layer on the quantum well layer;
   patterning the quantum well layer and the second-type semiconductor layer to form a plurality of nanorods;
   filling a transparent planar material into a space between the nanorods, wherein a top portion of each of the nanorods is exposed out of the transparent planar material;
   removing a portion of the second-type semiconductor layer, a part of the nanorods, a portion of the first-type semiconductor layer and a portion of the transparent planar material to form a trapezoid sidewall structure such that a portion of the first-type semiconductor layer is exposed; and
   forming a transparent electrode layer to cover the transparent planar material and the top portion.

2. The method according to claim 1, wherein the step of patterning the quantum well layer and the second-type semiconductor layer comprising:
   forming a quantum well structure in each of the nanorods, wherein each of the quantum well structure has a width W and a height H, and the width W and the height H satisfy the following formula (I):

$0.5\ H \leq W < 10\ H$ formula (I).

3. The method according to claim 2, wherein the step of patterning the quantum well layer and the second-type semiconductor layer comprising:
   forming a patterned hard mask on the second-type semiconductor layer, wherein a portion of the second-type semiconductor layer is exposed;
   removing the exposed portion of the second-type semiconductor layer and the quantum well layer there under to form the nanorods; and
   removing the patterned hard mask on the nanorods.

4. The method according to claim 3, wherein the step of filing the transparent planar material comprises filling benzocyclobutene into the space between the nanorods.

5. The method according to claim 4, further comprising a step of forming a first connecting pad and a second connecting pad respectively on the transparent electrode layer and the exposed portion of the first-type semiconductor layer.

6. The method according to claim 5, wherein the first-type semiconductor layer comprises N-type gallium nitride, and the second-type semiconductor layer comprises P-type gallium nitride.

7. The method according to claim 6, further comprising a step of forming an undoped gallium nitride layer on the substrate prior to forming the first-type semiconductor layer.

* * * * *